United States Patent [19]

Omoto

[11] Patent Number: 5,179,732
[45] Date of Patent: Jan. 12, 1993

[54] MIXER HAVING BALUN MOUNTED TO A SUPPORT BLOCK

[75] Inventor: Noriaki Omoto, Takatsuki, Japan

[73] Assignee: Matsushita Electric Industrial Co., Ltd., Osaka, Japan

[21] Appl. No.: 571,582

[22] PCT Filed: Dec. 28, 1989

[86] PCT No.: PCT/JP89/01318

§ 371 Date: Aug. 29, 1990

§ 102(e) Date: Aug. 29, 1990

[87] PCT Pub. No.: WO90/08425

PCT Pub. Date: Jul. 26, 1990

[30] Foreign Application Priority Data

Jan. 10, 1989 [JP] Japan .................... 1-3145

[51] Int. Cl.$^5$ ............................. H04B 1/26
[52] U.S. Cl. ....................... 455/330; 455/326
[58] Field of Search ........... 455/323, 325, 327, 326, 455/330, 334

[56] References Cited

U.S. PATENT DOCUMENTS 4,119,914  10/1978  Duncan .
4,864,644  9/1989  Takahashi et al. ............ 455/330
5,003,622  3/1991  Ma et al. ..................... 455/330

FOREIGN PATENT DOCUMENTS 60-28331(A)  2/1985  Japan .
63-22739  6/1988  Japan .

OTHER PUBLICATIONS

19th European Microwave Conference 89, London, Sep. 4th-7th 1989, pp. 731-736, I. Telliez et al.

Primary Examiner—Curtis Kuntz
Attorney, Agent, or Firm—Wenderoth, Lind & Ponack

[57] ABSTRACT

A diode type mixer includes a diode circuit and a balun transformer, and is used in a frequency convertor which converts a 1-GHz primary intermediate frequency signal to a secondary intermediate frequency signal in a satellite broadcast receiver. The balun transformer (5) is fixed to a support block (10), and the terminals of the balun transformer (5) are connected to the stems (11) of the support block (10). Hollow coils (12 and 13) are connected between the ground terminal and the balanced terminals of the support block (10). The high frequency characteristics of the mixer can be improved, and productivity in mass production can be enhanced.

1 Claim, 5 Drawing Sheets

MIXER HAVING BALUN MOUNTED TO A SUPPORT BLOCK

TECHNICAL FIELD

The present invention relates to a mixer used in a secondary frequency convertor in a receiver for satellite broadcasting.

BACKGROUND ART

In satellite broadcasting, radio waves in the 12-GHz band width are transmitted from geostationary broadcasting satellites located approximately 36,000 km above the equator, and the radio waves are received by high gain parabola antennas on the ground. The waves collected by the parabola antenna are frequency converted to the 1-GHz band by a low noise convertor, and then carried indoors by a coaxial cable. This frequency conversion is conventionally referred to as primary conversion. The 1-GHz band television signal conducted indoors is again frequency converted to a 400-MHz second intermediate frequency signal. This secondary frequency signal is signal processed for FM demodulation to obtain the video and audio signals. The secondary frequency convertor effects a tuning function, selecting one wave from the 1-GHz primary frequency signal to obtain the secondary frequency signal.

Devices conventionally used for secondary frequency signal convertors include transistor mixers, which use transistors, and diode mixers, which use diodes and balun-type transformers. While the transistor mixer offers the advantage of conversion gain, diode mixers are more commonly used due to their low intercept point.

A conventional device is described below with reference to the accompanying diagrams. FIG. 1 is an equivalent circuit diagram for of a frequently used double balun transformer mixer. In FIG. 1, reference numerals 4 and 5 denote balun transformers, and reference numerals 6, 7, 8 and 9 denote diodes. There is a degree of inherent isolation in this mixer because the ports are balanced, and the design of the isolation filter is simplified because the leakage to the intermediate frequency output terminal 2 of the local oscillation signal applied to terminal 3 and the high frequency input signal applied to terminal 1 is low.

FIG. 2 is an equivalent circuit diagram for a single balun transformer mixer. In FIG. 2, reference numeral 5 denotes a balun transformer, and reference numerals 6 and 7 denote diodes. The features of the single balun transformer mixer include a simpler construction and lower cost than a double balun transformer mixer, and low conversion loss because of the smaller number of diodes and balun transformers. On the other hand, because the high frequency input terminal 1 and the intermediate frequency output terminal 1 are not isolated, a filter with better attenuation characteristics is required (Ref.: "Koushuha Kairo no Sekkei to Jissai (Design and practice of high frequency circuits)", by Yukihiko Miyamoto, issued October 1987).

A balun transformer is generally comprised of a compact toroidal core and a so-called "spectacle" core, constructed by wrapping a 0.1–0.3 mm diameter wire around the core 5' as shown in FIG. 3 (Ref.: "Minseiyou Koushuha Device Handbook (Handbook of high frequency devices for consumer applications)", NEC Co., Ltd, June 1986). In FIG. 3, reference numerals 30 and 31 denote unbalanced terminals, reference numerals 32 and 33 denote balanced terminals, and reference numeral 34 denotes a ground terminal.

An example of a mixer comprised of the balun transformer and diodes as thus described mounted on a printed circuit board is shown in FIGS. 4a and b. The frequency characteristic of the conversion loss, which is the most important characteristic of a mixer circuit, is approximately 6–7 dB as shown in FIG. 5, which is slightly lower than the 8–10 dB conversion loss in a double balanced mixer.

The operation of a single balun mixer constructed as described above is discussed hereinbelow. The function of the balun transformer 5 shown in FIG. 2 is to unbalance-balance convert the local oscillator output signal applied to the local oscillator input terminal 3, and insert the converted signal to diodes 6 and 7. What is important here is that the balun transformer 5 is balanced, which means that the phase of the local oscillator output component at points A and C is each ±90° to point B (a center tap of the coil). If the transformer is thus balanced, the separated local oscillator output signal is canceled respectively at the high frequency input terminal and the intermediate frequency output terminal 1, i.e., isolation is good. A Schottky barrier diode is normally used for the diodes 6 and 7 because a sufficiently high speed switching characteristic is required for high frequency signals. As these diodes are switched on/off by the local oscillator signal, an equivalent circuit as shown in FIG. 6 can be constructed. (Ref.: ("Toroiguru koa Katsuyou Hyakka (Encyclopedia of toroidal core applications)", p, 270, Hideo Yamamura, issued January 1983).

Referring to FIG. 6, because the high frequency input signal applied to terminal 1 is switched by the local oscillator signal, an output having the components as shown in the following formula appears at the intermediate frequency output terminal 1.

$$f_{IFm,n} = \pm m f_{RF} \pm n f_{LO}$$

where m, n = 0, 1, 2, 3 . . .

$f_{IF}$: intermediate frequency $f_{RF}$: high frequency input frequency $f_{LO}$: local oscillator signal frequency.

In the above equation, m = n = 0 is the DC component which is normally blocked. In addition, a high output is removed by the LPF connected to the intermediate frequency output terminal, and the difference component of the frequency of the local oscillator signal and the high frequency input signal is extracted as the intermediate frequency signal, thereby effecting a frequency convertor function.

However, in a conventional mixer as shown in FIG. 4, it is necessary to electrically connect by means of soldering the wires which act as the input/output terminals of the balun transformer 5 after mounting the balun transformer 5 to the printed circuit board 14 by inserting the wires into holes provided in the printed circuit board 14. The wires used for the balun transformer 5 are light copper wires of a 0.1–0.3 mm diameter and coated with a polyurethane or other protective coating. These soft wires are hard to insert in the circuit board holes during mounting and can be easily bent, thereby resulting in variations in conversion gain and other performance characteristics.

SUMMARY OF THE INVENTION

With respect to the above problems, the present invention provides a mixer with excellent high frequency characteristics, minimal variation in performance resulting during mass production, and which can be easily mounted on a printed circuit board.

To achieve the aforementioned objective, a mixer according to the present invention comprises a balun transformer comprising a pair of ferrite core, wire-wrapped unbalanced terminals, a pair of ferrite core, wire-wrapped balanced terminals and a ground terminal, a support block which secures the balun transformer and which comprises plural conductive stems to which are connected the terminals of the balun transformer, diodes connected serially at a same polarity between the pair of balanced terminals, and a hollow coil connected between the balanced terminals of the support block and the ground terminal, wherein the pair of unbalanced terminals serve as a local oscillator input terminal, and the contact point of the serially connected diodes serves as a high frequency input terminal and an intermediate frequency output terminal.

In a mixer constructed according to the present invention, the local oscillator signal is input to the input terminal of the balun transformer wherein one terminal of the pair of unbalanced terminals is the ground terminal and the other terminal is the input terminal. The input local oscillator signal is unbalance-balance converted by the balun transformer, forming between the balanced terminal and ground terminal a balanced signal the phase of which differs 180° from the original input signal. This balanced local oscillator signal switches the same-phase diode connected serially between the balanced terminals ON at one half of the cycle of the local oscillator signal, and switches the diode OFF at the other half of the cycle. Thus, the amplitude of the input local oscillator signal must be sufficiently large to make the use of the diodes continuous. Because the high frequency signal is input to the contacts of the serially connected diodes, the high frequency signal is switched by the diode at the cycle of the local oscillator signal. This switching action produces a signal comprising an intermediate frequency signal and a high frequency component at the intermediate frequency output terminal by means of mixing the high frequency signal and local oscillator signal. If this signal is extracted through a low pass filter (LPF) connected to the intermediate frequency output terminal, an isolated intermediate frequency signal can be obtained.

Considering the impedance from the high frequency input terminal side to the diode switched by the local oscillator signal, the mixer operation is executed efficiently because the impedance between a ground state and open state even if the lead length from the balun transformer balanced terminal to the diode contact is sufficiently short. However, in the case of the present invention, a support block with stems is used to fix the balun transformer, and the length of the lead between the balanced terminals of the balun transformer and the contacts with the diode cannot be ignored, and the conversion loss of the mixer deteriorates the higher the frequency of the signal processed. This is because the impedance from the high frequency input terminal to the diode is not switched between the ground and open states ideal for mixer operation. Thus, if the impedance is reduced by connecting a hollow coil between the ground terminals and the contacts of the stems, which are the balanced terminals of the support block, and the diodes, the deterioration in the conversion loss of the mixer can be recovered. It is to be noted that while the amplitude of the local oscillator signal is attenuated slightly by the use of a hollow coil, this is no particular problem for the local frequency conversion that occurs in a satellite broadcast receiver.

Furthermore, by using identical hollow coils, the loss of balance in the balanced terminals of the balun transformer can be prevented, and leakage of the local oscillator signal to the high frequency input terminal does not become worse.

BEST MODE FOR CARRYING OUT THE INVENTION

Figure 1:
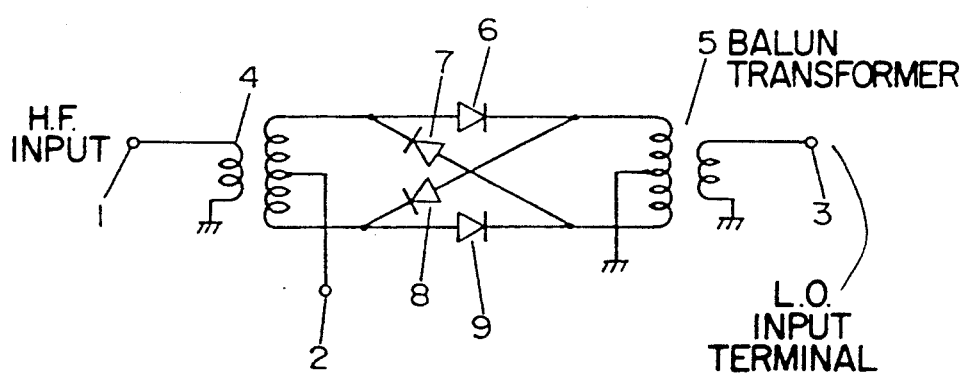
FIG. 1 is an equivalent circuit diagram for a conventional double balanced mixer.
Figure 2:
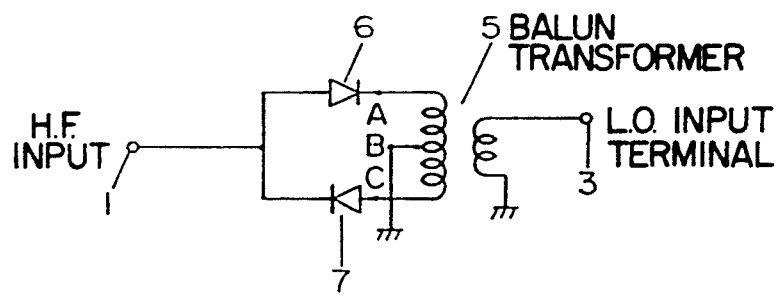
FIG. 2 is an equivalent circuit diagram for a conventional single balanced mixer.
Figure 3:
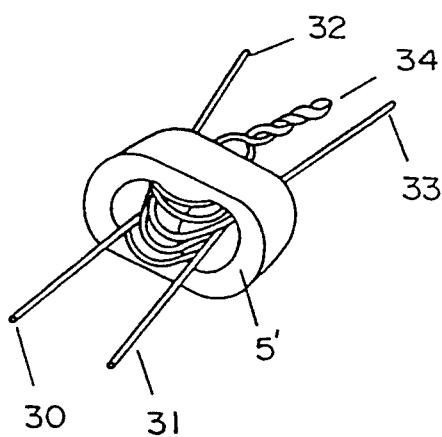
FIG. 3 is an oblique view of a balun transformer.
Figure 4A:
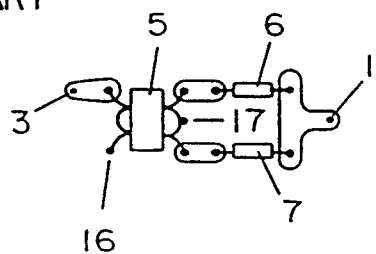
FIGS. 4(a) and (b) are plane views and side views, respectively, of a conventional single balanced mixer.
Figure 4B:
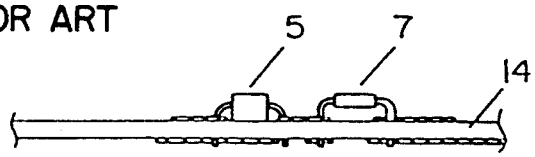
Figure 5:
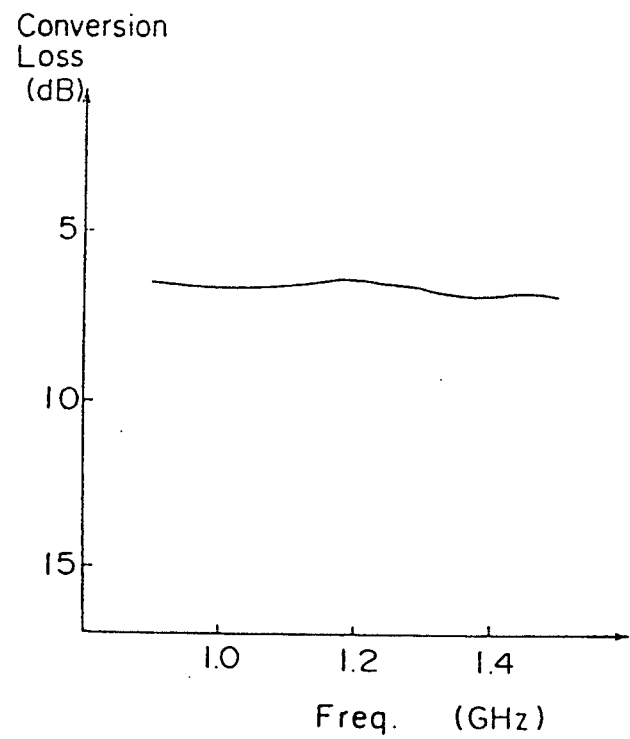
FIG. 5 is a frequency characteristics diagram of conversion loss in a conventional single balanced mixer.
Figure 6:
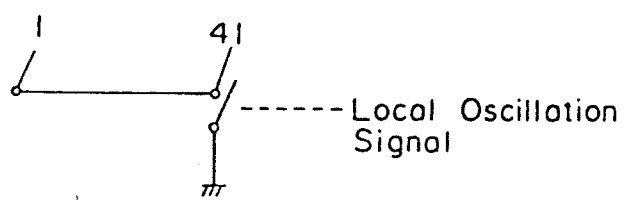
FIG. 6 is an equivalent circuit diagram for a conventional single balanced mixer.
Figure 7A:
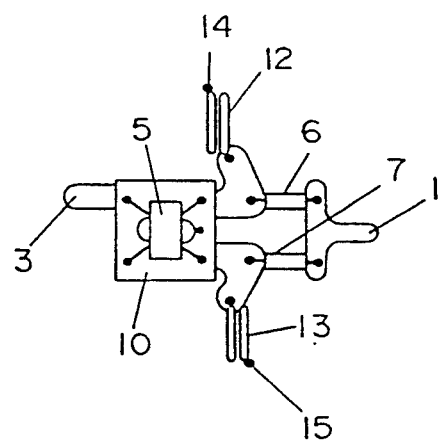
FIGS. 7(a) and (b) are plane views and side views, respectively, of a mixer according to a preferred embodiment of the present invention.
Figure 7B:
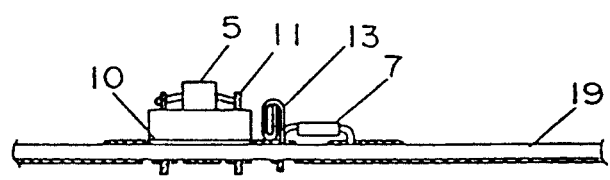
Figure 8:
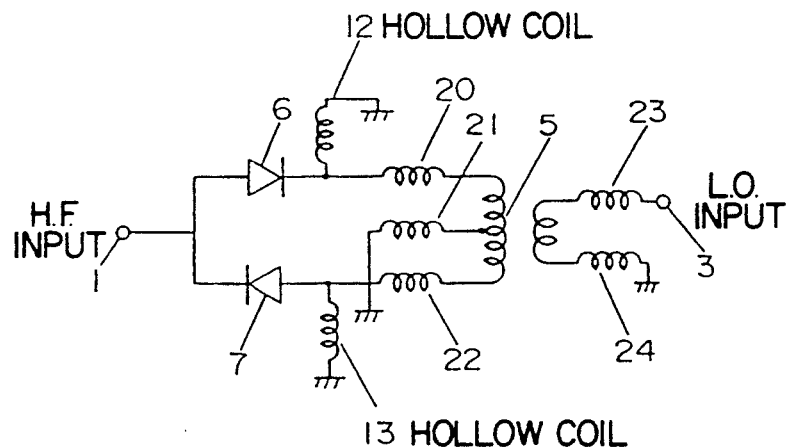
FIG. 8 is an equivalent circuit in a preferred embodiment of the present invention.

A preferred embodiment of the present invention is described hereinbelow with reference to the accompanying diagrams. FIGS. 7(a) and (b) show a mixer according to a preferred embodiment of the present invention wherein reference number 1 denotes a high frequency input terminal and an intermediate frequency output terminal, reference numeral 3 denotes a local oscillator input terminal, reference numeral 5 denotes a balun transformer used for unbalanced-balanced conversion of a local oscillator signal, reference numerals 6 and 7 denote Schottky barrier diodes switched by a local oscillator signal, and reference numeral 10 denotes a support block which secures the balun transformer 5 and facilitates insertion of the balun transformer 5 to a printed circuit board 19. Additionally, reference numeral 11 denotes a support block stem connected to a balun transformer 5 terminal, reference numerals 12 and 13 denotes hollow coils, one end of each being connected to the pair of balanced terminals of the balun transformer 5 via the support block stem 11, and the other end of each being connected to a ground terminal (ground through-holes) 14 and 15. The equivalent circuit of FIG. 7 is shown in FIG. 8. In FIG. 8, the inductance component of the support block 10 stem 11 is denoted by inductances 20, 21, 22, 23 and 24.

Figure 9:
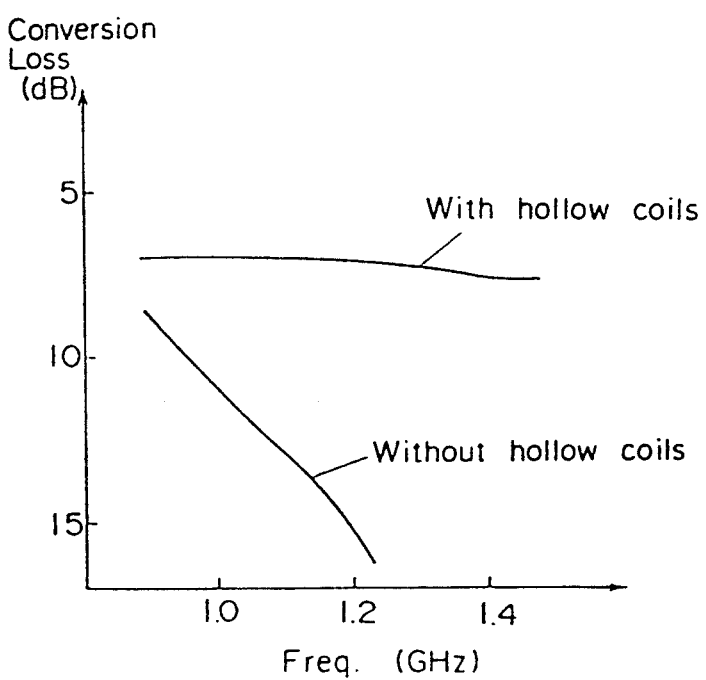
FIG. 9 is a frequency characteristics diagram of conversion loss in a mixer according to the present invention.

The local oscillator signal input from the local oscillator input terminal 3 is unbalance-balance converted by the balun transformer 5 and supplied to diodes 6 and 7, thus switching the diodes 6 and 7. At this time, the impedance from the high frequency input terminal 1 to the diode is not switched by the inductance components 20, 21 and 22 resulting at the support block stem 11 to the ideal ground and open states for mixer operation. Specifically, the conversion loss from the mixer when the hollow coil is not connected is in the high frequency band as shown in FIG. 9, and the frequency characteristics are poor. To compensate for this, if the impedance at the contact of the diodes 6 and 7 and support block 10 is lowered by the hollow coils 12 and 13, deterioration of mixer conversion loss can be corrected as shown in FIG. 9. A hollow coil made from 0.6 mm diameter wire wrapped 1.5 turn to a 3 mm diameter is sufficient to provide this compensation, and there is minimal change in the characteristics of the mixer even if the inductance of the hollow coil is changed slightly. While conversion loss recovery is improved with a lower inductance, this increases the load of the VCO (local oscillator circuit). This makes it easier for oscillation to stop, and caution is therefore required in designing the inductance characteristic.

It is to be noted that while the hollow coils 12 and 13 are used in the present embodiment to compensate for the inductance component of the support block 10, an equivalent effect can be achieved by forming a microstrip line 0.3 mm wide and approximately 25 mm long on the printed circuit board in place of the hollow coil. This substitution, however, is applicable when the printed circuit board is manufactured from a glass epoxy material and is 1.0 mm thick. If a microstrip line is used, the change in mixer characteristics is minimal if the length and/or width is changed slightly. Furthermore, if the diodes 6 and 7 are surface mountable diodes, then virtually all of the components comprising the mixer can be assembled in a surface mounting process.

Furthermore, while the most basic relay transformer wrapping method using a so-called "spectacle" core is shown for the balun transformer, when a normal relay transformer or a balun transformer using a toroidal core is used and fixed to the support block, high frequency conversion loss deteriorates, but this deterioration can be recovered by means of a hollow coil.

INDUSTRIAL APPLICABILITY

According to the present invention, a mixer with outstanding high frequency characteristics, minimal variation in performance resulting from mass production, and which can be easily mounted on a printed circuit board can be provided by fixing a balun transformer on a support block, and compensating for the inductance component arising from the support block stem by means of a hollow coil.

I claim:
1. A mixer comprising:
   a balun transformer having a wire-wrapped ferrite core, first and second unbalanced terminals, first and second balanced terminals, and a ground terminal;
   a support block member having said balun transformer secured thereto and including plural conductive stems respectively connected to said first and second unbalanced terminals, said first and second balanced terminals, and said ground terminal of said balun transformer;
   a series connection of first and second diodes connected between said first and second balanced terminals of said balun transformer, said first and second diodes arranged in a same polarity along said series connection;
   a first hollow coil having one end connected to said first balanced terminal of said balun transformer and another end connected to said ground terminal of said balun transformer; and
   a second hollow coil having one end connected to said second balanced terminal of said balun transformer and another end connected to said ground terminal of said balun transformer;
   wherein said first and second unbalanced terminals serve as a local oscillator input, and wherein a connecting point between said first and second diodes serves as a high frequency input terminal and an intermediate frequency output terminal.

* * * * *